United States Patent
Tan

(10) Patent No.: US 8,533,385 B2
(45) Date of Patent: Sep. 10, 2013

(54) METHOD FOR PREVENTING READ-DISTURB HAPPENED IN NON-VOLATILE MEMORY AND CONTROLLER THEREOF

(75) Inventor: Chen Yap Tan, Hsinchu (TW)

(73) Assignee: Phison Electronics Corp., Miaoli (TW)

( * ) Notice: Subject to any disclaimer, the term of this patent is extended or adjusted under 35 U.S.C. 154(b) by 0 days.

(21) Appl. No.: 13/240,430

(22) Filed: Sep. 22, 2011

(65) Prior Publication Data

US 2012/0011309 A1  Jan. 12, 2012

Related U.S. Application Data

(62) Division of application No. 12/025,475, filed on Feb. 4, 2008, now Pat. No. 8,055,834.

(30) Foreign Application Priority Data

Dec. 31, 2007 (TW) .............................. 96151575 A

(51) Int. Cl.
   *G06F 12/00* (2006.01)
   *G06F 13/00* (2006.01)
   *G06F 13/28* (2006.01)
   *G11C 11/34* (2006.01)
   *G11C 16/04* (2006.01)

(52) U.S. Cl.
   USPC ...................................... 711/103; 365/185.03

(58) Field of Classification Search
   USPC ...................................... 711/103; 365/185.03
   See application file for complete search history.

(56) References Cited

U.S. PATENT DOCUMENTS

| 2003/0046487 A1* | 3/2003 | Swaminathan | 711/106 |
| 2007/0133295 A1* | 6/2007 | Fong et al. | 365/185.21 |
| 2007/0171744 A1* | 7/2007 | Mokhlesi et al. | 365/203 |
| 2008/0104310 A1* | 5/2008 | Stern et al. | 711/103 |
| 2008/0117663 A1* | 5/2008 | Philipp et al. | 365/148 |
| 2009/0172252 A1* | 7/2009 | Tomlin et al. | 711/103 |

FOREIGN PATENT DOCUMENTS

| CN | 1591685 | 3/2005 |
| JP | 8279295 | 10/1996 |
| TW | M320715 | 10/2007 |

OTHER PUBLICATIONS

Chinese First Examination Report of China Application No. 200810005154.4, dated Nov. 9, 2011.
"Office Action of China Counterpart Application", issued on Mar. 21, 2013, p. 1-p. 6.

* cited by examiner

*Primary Examiner* — Ryan Bertram
(74) *Attorney, Agent, or Firm* — J.C. Patents

(57) ABSTRACT

A method for preventing read-disturb happened in non-volatile memory and a controller thereof are disclosed. The non-volatile memory includes a plurality of blocks, and each block includes a plurality of pages. The method includes storing a program code executed by a controller of the non-volatile memory storage device for controlling the non-volatile memory storage device into at least a first block of the blocks; and copying the program code stored in the first block into at least a second block of the blocks when power is supplied to the non-volatile memory storage device.

14 Claims, 4 Drawing Sheets

METHOD FOR PREVENTING READ-DISTURB HAPPENED IN NON-VOLATILE MEMORY AND CONTROLLER THEREOF

CROSS-REFERENCE TO RELATED APPLICATION

This application is a divisional of and claims the priority benefit of U.S. application Ser. No. 12/025,475, filed on Feb. 4, 2008, now allowed, which claims the priority benefit of Taiwan application serial no. 96151575, filed on Dec. 31, 2007. The entirety of each of the above-mentioned patent applications is hereby incorporated by reference herein and made a part of this specification.

BACKGROUND OF THE INVENTION

1. Field of the Invention

The present invention relates to a read technique for a storage media. More particularly, the present invention relates to a method for preventing read-disturb happened in a non-volatile memory and a controller thereof.

2. Description of Related Art

Recently, with quick development of digital cameras, camera cell phones, MP3s and MP4s, requirement for storage media thereof is increased accordingly. In view of all the present storage media, since a flash memory has features of non-volatile, power saving, small size and non-mechanical structure etc., it is suitable for being built within the aforementioned portable multimedia devices. Moreover, since demanding of external products such as small memory cards and flash drives is relatively great, improving of storage volume and reliability of the flash memory becomes a major subject to various flash memory manufacturers.

Generally, the flash memories are grouped into two types according to fabrication precision thereof. It is known that the flash memories fabricated based on low fabrication precision are referred to as single level cell (SLC) flash memories, and the flash memories fabricated based on high fabrication precision are referred to as multi level cell (MLC) flash memories. Wherein, memory volume of the MLC flash memory is higher than that of the SLC flash memory, though utilization reliability of the MLC flash memory is lower than that of the SLC flash memory.

However, if data stored within a same block of the MLC flash memory or the SLC flash memory is repeatedly read, for example, if read times of the data is between a hundred thousand times and a million times, reading error of the data may be occurred, or even the data stored within the block may be lost or becomes abnormal, and such phenomenon is referred to as "read-disturb" to those skilled in the art. Therefore, various manufacturers now devote to develop techniques for preventing such read-disturb phenomenon, so as to effectively suppress a chance of read-disturb.

SUMMARY OF THE INVENTION

Accordingly, the present invention is directed to a method for preventing read-disturb happened in a non-volatile memory and a controller thereof, by which chance of read-disturb may be effectively suppressed, and data stored within the non-volatile memory may be correctly read.

The present invention provides a method for preventing read-disturb happened in a non-volatile memory. The method is suitable for a non-volatile memory storage device, wherein the non-volatile memory comprises a plurality of blocks, and the blocks are grouped into at least a data group and a spare group, each block includes a plurality of pages. The method includes the following steps. First, read times for at least a first block of the blocks in the data group is recorded. Next, when the read times of the first block is greater than a predetermined value, data originally stored in the first block is renewed.

In an embodiment of the present invention, the step of recording the read times of the first block includes recording the read times of the first block by using a read times table, wherein the read times table has a first counting value corresponding to the first block, and the first counting value represents the read times of the first block.

In another embodiment of the present invention, the step of recording the read times of the first block includes recording read times of at least a first page within the pages of the first block by using a read times table, wherein the read times table has a first counting value corresponding to the first page, and the first counting value represents the read times of the first block.

In an embodiment of the present invention, the step of renewing the data originally stored in the first block includes the following steps. First, the data originally stored in the first block is copied into a second block in the spare group, wherein the read times table further has a second counting value corresponding to the second block, and the second counting value represents read times of the second block. Next, the first block is substituted with the second block, and the first counting value is renewed.

In an embodiment of the present invention, the step of renewing the data originally stored in the first block further includes the following steps. First, data originally stored in at least a third block adjacent to the first block is copied into a fourth block in the spare group, wherein the read times table further has a third counting value and a fourth counting value respectively corresponding to the third block and the fourth block, and the third counting value and the fourth counting value respectively represent read times of the third block and the fourth block. Next, the third block is substituted with the fourth block, and the third counting value is renewed.

In another embodiment of the present invention, the step of renewing the data originally stored in the first block includes the following steps. First, the data originally stored in the first block is copied into a second block in the spare group, wherein the read times table further has a second counting value corresponding to at least a second page within the pages of the second block, and the second counting value represents read times of the second block. Next, the first block is substituted with the second block, and the first counting value is renewed.

In another embodiment of the present invention, the step of renewing the data originally stored in the first block further includes the following steps. First, data originally stored in at least a third block adjacent to the first block is copied into a fourth block in the spare group, wherein the read times table further has a third counting value corresponding to at least a third page within the pages of the third block and a fourth counting value corresponding to at least a fourth page within the pages of the fourth block, and the third counting value and the fourth counting value respectively represent read times of the third block and the fourth block. Next, the third block is substituted with the fourth block, and the third counting value is renewed.

In still another embodiment of the present invention, the step of renewing the data originally stored in the first block includes the following steps. First, the data originally stored in the first block is read, and is temporarily stored into a buffer memory of the controller of the non-volatile memory storage device. Next, the first block is erased. Next, the data temporarily stored in the buffer memory which is originally stored in the first block is written back to the first block. Finally, the first counting value is renewed.

In yet another embodiment of the present invention, the step of renewing the data originally stored in the first block further includes the following steps. First, data originally stored in at least a second block adjacent to the first block is read, and is temporarily stored into the buffer memory, wherein the read times table further has a second counting value corresponding to the second block, and the second counting value represents read times of the second block. Next, the second block is erased. Next, the data temporarily stored in the buffer memory which is originally stored in the second block is written back to the second block. Finally, the second counting value is renewed.

The present invention provides a method for preventing read-disturb happened in a non-volatile memory. The method is suitable for a non-volatile memory storage device, wherein the non-volatile memory comprises a plurality of blocks, and each block includes a plurality of pages. The method includes the following steps. First, a program code executed by a controller of the non-volatile memory storage device for controlling the non-volatile memory storage device is stored into at least a first block of the blocks. Next, when power is supplied to the non-volatile memory storage device, the program code stored in the first block is copied into at least a second block of the blocks.

In an embodiment of the present invention, the method for preventing read-disturb happened in a non-volatile memory submitted by the present invention further includes recording read times of the second block, and renewing the program code stored in the second block when the read times of the second block is greater than a predetermined value.

In an embodiment of the present invention, the step of recording the read times of the second block includes recording the read times of the second block by using a read times table, wherein the read times table has a first counting value corresponding to the second block, and the first counting value represents the read times of the second block.

In another embodiment of the present invention, the step of recording the read times of the second block includes recording read times of at least a first page within the pages of the second block by using a read times table, wherein the read times table has a first counting value corresponding to the first page, and the first counting value represents read times of the second block.

In an embodiment of the present invention, the step of renewing the program code stored in the second block includes the following steps. First, the program code stored in the second block is copied into at least a third block of the blocks, wherein the read times table further has a second counting value corresponding to the third block, and the second counting value represents read times of the third block. Next, the second block is substituted with the third block, and the first counting value is renewed.

In an embodiment of the present invention, the step of renewing the program code stored in the second block further includes the following steps. First, data originally stored in at least a fourth block adjacent to the second block is copied into a fifth block of the blocks, wherein the read times table further has a third counting value and a fourth counting value respectively corresponding to the fourth block and the fifth block, and the third counting value and the fourth counting value respectively represent read times of the fourth block and the fifth block. Next, the fourth block is substituted with the fifth block, and the third counting value is renewed.

In another embodiment of the present invention, the step of renewing the program code stored in the second block includes the following steps. First, the program code stored in the second block is copied into at least a third block of the blocks, wherein the read times table further has a second counting value corresponding to at least a second page within the pages of the third block, and the second counting value represents read times of the third block. Next, the second block is substituted with the third block, and the first counting value is renewed.

In another embodiment of the present invention, the step of renewing the program code stored in the second block further includes the following steps. First, data originally stored in at least a fourth block adjacent to the second block is copied into a fifth block of the blocks, wherein the read times table further has a third counting value corresponding to at least a third page within the pages of the fourth block and a fourth counting value corresponding to at least a fourth page within the pages of the fifth block, and the third counting value and the fourth counting value respectively represent read times of the fourth block and the fifth block. Next, the fourth block is substituted with the fifth block, and the third counting value is renewed.

In still another embodiment of the present invention, the step of renewing the program code stored in the second block includes the following steps. First, the program code stored in the second block is read, and is temporarily stored into a buffer memory of the controller. Next, the second block is erased. Next, the program code temporarily stored in the buffer memory which is originally stored in the second block is written back to the second block. Finally, the first counting value is renewed.

In yet another embodiment of the present invention, the step of renewing the program code stored in the second block further includes the following steps. First, data originally stored in at least a third block adjacent to the second block is read, and is temporarily stored into the buffer memory, wherein the read times table further has a second counting value corresponding to the third block, and the second counting value represents read times of the third block. Next, the third block is erased. Next, the data temporarily stored in the buffer memory which is originally stored in the third block is written back to the third block. Finally, the second counting value is renewed.

In an embodiment of the present invention, the read times table is stored in internal or external of the non-volatile memory.

In an embodiment of the present invention, the non-volatile memory is a single level cell (SLC) flash memory or a multi level cell (MLC) flash memory.

The present invention provides a controller, which is suitable for a non-volatile memory storage device. The controller includes a micro processing unit, a non-volatile memory interface, a buffer memory and a memory management module. The micro processing unit is used for controlling a whole operation of the controller. The non-volatile memory interface is electrically coupled to the micro processing unit, and is used for accessing the non-volatile memory, wherein the non-volatile memory includes a plurality of blocks, and the blocks are grouped into at least a data group and a spare group. The buffer memory is electrically coupled to the micro processing unit, and is used for temporarily storing data.

The memory management module is electrically coupled to the micro processing unit, and is used for managing the non-volatile memory, wherein the memory management module applies a method for preventing read-disturb happened in the non-volatile memory. The method includes the following steps. First, read times for at least a first block of the blocks within the data group is recorded. Next, when the read times of the first block is greater than a predetermined value, data originally stored in the first block is renewed.

In an embodiment of the present invention, the step of recording the read times of the first block includes recording the read times of the first block by using a read times table, wherein the read times table has a first counting value corresponding to the first block, and the first counting value represents the read times of the first block.

In an embodiment of the present invention, the step of renewing the data originally stored in the first block includes the following steps. First, the data originally stored in the first block is written back into the first block, and the first counting value is renewed; alternatively, the data originally stored in the first block is copied into a second block within the spare group, and the first block is substituted with the second block, and then the first counting value is renewed. The read times table further has a second counting value corresponding to the second block, and the second counting value represents read times of the second block.

In an embodiment of the present invention, the step of renewing the data originally stored in the first block further includes simultaneously renewing data originally stored in at least a third block adjacent to the first block, wherein the read times table further has a third counting value corresponding to the third block, and the third counting value represents read times of the third block.

The present invention provides a controller, which is suitable for a non-volatile memory storage device. The controller includes a micro processing unit, a non-volatile memory interface, a buffer memory and a memory management module. The micro processing unit is used for controlling a whole operation of the controller. The non-volatile memory interface is electrically coupled to the micro processing unit, and is used for accessing the non-volatile memory, wherein the non-volatile memory includes a plurality of blocks. The buffer memory is electrically coupled to the micro processing unit, and is used for temporarily storing data.

The memory management module is electrically coupled to the micro processing unit, and is used for managing the non-volatile memory, wherein the memory management module applies a method for preventing read-disturb happened in the non-volatile memory. The method includes the following steps. First, a program code executed by the controller for controlling the non-volatile memory storage device is stored into at least a first block of the blocks. Next, when power is supplied to the non-volatile memory storage device, the program code stored in the first block is copied into at least a second block of the blocks.

In an embodiment of the present invention, the method for preventing read-disturb happened in a non-volatile memory executed by the memory management module further includes recording read times of the second block, and renewing the program code stored in the second block when the read times of the second block is greater than a predetermined value.

In an embodiment of the present invention, the step of recording the read times of the second block includes recording the read times of the second block by using a read times table, wherein the read times table has a first counting value corresponding to the second block, and the first counting value represents the read times of the second block.

In an embodiment of the present invention, the step of renewing the program code stored in the second block includes writing the program code stored in the second block back to the second block, and renewing the first counting value; alternatively, copying the program code stored in the second block into at least a third block of the blocks, and substituting the second block with the third block, and then renewing the first counting value, wherein the read times table further has a second counting value corresponding to the third block, and the second counting value represents read times of the third block.

In an embodiment of the present invention, the step of renewing the program code stored in the second block further includes simultaneously renewing data originally stored in at least a fourth block adjacent to the second block, wherein the read times table further has a third counting value corresponding to the fourth block, and the third counting value represents read times of the fourth block.

To prevent the read-disturb, in the method for preventing read-disturb happened in a non-volatile memory provided by the present invention, a read times table may be used for recording read times of at least one/each block or page within the non-volatile memory. Accordingly, when the read times of a certain block or a certain page within the non-volatile memory is greater than a predetermined value, data stored in this block or the block where the page belongs to is then renewed. Therefore, according to the method for preventing read-disturb happened in a non-volatile memory provided by the present invention, not only chances of read-disturb is effectively suppressed, but also all data stored in the non-volatile memory may be correctly read.

In order to make the aforementioned and other objects, features and advantages of the present invention comprehensible, a preferred embodiment accompanied with figures is described in detail below.

DESCRIPTION OF EMBODIMENTS

A technique function to be achieved by the present invention is to effectively suppress a chance of read-disturb, so as to correctly read all data stored in the non-volatile memory. In the following content, technique features and technique functions to be achieved by the present invention are described in detail for those skilled in the art.

Figure 1:
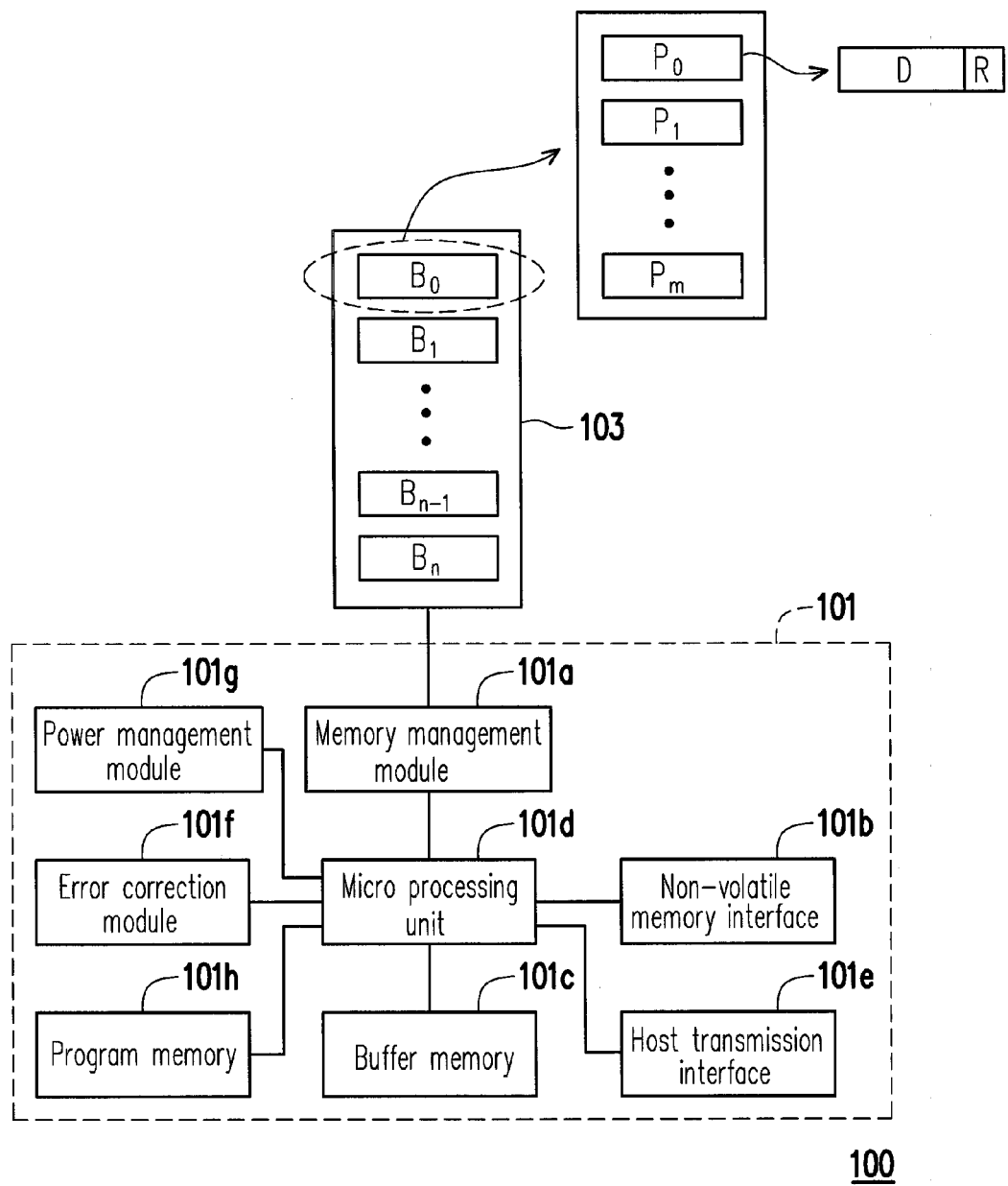
FIG. 1 is a system block diagram illustrating a non-volatile memory storage device.

FIG. 1 is a system block diagram illustrating a non-volatile memory storage device 100. Referring to FIG. 1, the non-volatile memory storage device 100 generally includes a controller 101 and a non-volatile memory 103. The controller 101 is used for controlling a whole operation of the non-volatile memory storage device 100, for example, operations such as data storage, data reading or data erasing etc. In the present embodiment, the controller 101 includes a memory management module 101*a*, a non-volatile memory interface 101*b*, a buffer memory 101*c* and a micro processing unit 101*d*. The memory management module 101*a* is used for managing the non-volatile memory 103, for example, executing the method for preventing read-disturb happened in the non-volatile memory provided by the present invention, managing damaged blocks, and maintaining a mapping table etc.

The non-volatile memory interface 101b is used for accessing the non-volatile memory 103. Namely, data to be written into the non-volatile memory 103 from an external host (not shown, which may be any data storage system, such as a computer, a digital camera, a video camera, a communication device, an audio player or a video player etc.) is first transformed into a data format which may be accepted by the non-volatile memory 103 via the non-volatile memory interface 101b.

The buffer memory 101c is used for temporarily storing system data (for example a mapping table) or data to be read or written by the host. In the present embodiment, the buffer memory 101c is a static random access memory (SRAM). However, it should be understood that the present invention is not limited thereto, and a dynamic random access memory (DRAM), a magnetic random access memory (MRAM), a phase-change random access memory (PRAM) or other suitable memories may also be applied in the present invention. The micro processing unit 101d is used for controlling a whole operation of the controller 101.

In the present embodiment, the controller 101 further includes a host transmission interface 101e, an error correction module 101f, a power management module 101g and a program memory 101h. The host transmission interface 101e is used for communicating with the host. The host transmission interface 101c may be a USB interface, an IEEE1394 interface, a SATA interface, a PCI express interface, a SAS interface, a MS interface, a MMC interface, a SD interface, a CF interface or an IDE interface.

The error correction module 101f is used for calculating an error correcting code, so as to check and correct data to be read or written by the host. The power management module 101g is used for managing a power supply of the non-volatile memory storage device 100. The program memory 101h is used for storing a program code executed by the controller 101 for controlling the non-volatile memory storage device 100.

The non-volatile memory 103 is used for storing data. In the present embodiment, the non-volatile memory 103 is a flash memory which may be a single level cell (SLC) flash memory or a multi level cell (MLC) flash memory.

It is known that the non-volatile memory is generally divided into a plurality of physical blocks, and each physical block is generally divided into a plurality of pages. In the present embodiment, the non-volatile memory 103 has the plurality of blocks $B_0$~$B_n$ (arrangement type thereof is not limited to that shown in FIG. 1), and each of the blocks $B_0$~$B_n$ may include the plurality of pages $P_0$~$P_m$ (arrangement type thereof is not limited to that shown in FIG. 1) which is the same to that of the block $B_0$.

Generally, each of the pages includes a data memory area D and a data redundant area R. The data memory area D is used for storing user data, and the data redundant area R is used for storing the system data, for example, the above error correction code (ECC).

To effectively manage the non-volatile memory 103, the blocks $B_0$~$B_n$ of the non-volatile memory 103 are logically grouped into a system group, a data group and a spare group. Generally, the blocks belonged to the data group within the non-volatile memory 103 occupy more than 90% of all the blocks $B_0$~$B_n$, and the rest blocks belong to the system group and the spare group. Wherein, the blocks within the system group are mainly used for recording the system data such as area number, block number of each area, page number of each block, logical-physical mapping table etc. related to the non-volatile memory 103.

The blocks within the data group are mainly used for storing the user data. The blocks within the spare group are mainly used for substituting the blocks within the data group. Therefore, the blocks within the spare group are empty blocks, namely, no data is recorded therein or only data marked to be invalid are stored therein.

Moreover, to effectively suppress the read-disturb occurred during repeat reading of the non-volatile memory 103, the method for preventing read-disturb happened in the non-volatile memory provided by the present invention will be described in detailed below for those skilled in the art.

Figure 2:
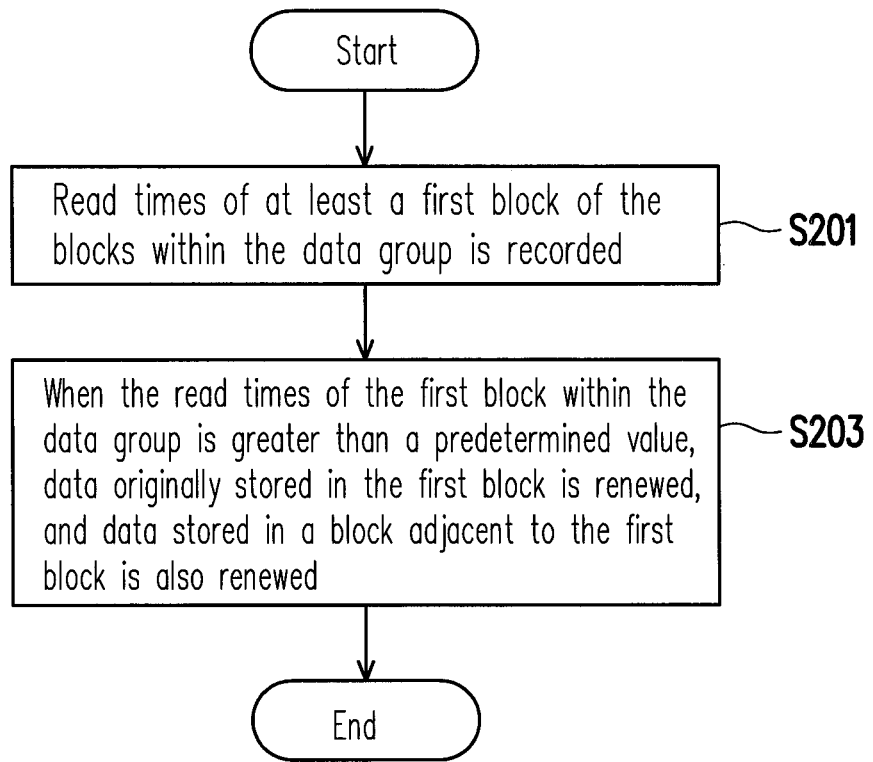
FIG. 2 is a flowchart illustrating a method for preventing read-disturb of a non-volatile memory according to an embodiment of the present invention.

FIG. 2 is a flowchart illustrating a method for preventing read-disturb of a non-volatile memory according to an embodiment of the present invention. Referring to FIG. 1 and FIG. 2, the method for preventing read-disturb happened in a non-volatile memory of the present invention includes the following steps. First, in step S201, read times of at least a first block of the blocks within the data group is recorded.

In the present invention, a read times table is applied for recording the read times of each block within the data group, wherein the read times table may be stored in the buffer memory 101c, though the present invention is not limited thereby. Moreover, the controller 101 may control a counter (not shown) therein to count the read times of each block within the data group, and may record the read times of each block within the data group into the read times table. Therefore, the read times table may contain a counting value corresponding to each block within the data group, and the counting values respectively represent the read times of each block within the data group. For example, when the counting value corresponding to the read times of the block $B_0$ within the data group that is recorded in the read times table is 100, it represents data stored in the block $B_0$ has been read for 100 times.

Accordingly, in the present embodiment, the read times table records the read times of the first block, and the read times table has a first counting value corresponding to the first block, wherein the first counting value represents the read times of the first block.

It should be noted that during operation of the non-volatile memory storage device 100, each time when a certain block within the data group is read, content recorded within the read times table of the buffer memory 105 is then continually renewed under control of the controller 101, and after operation of the non-volatile memory storage device 100 is completed, or after every several operation of the non-volatile memory storage device 100, the content recorded in the read times table is then recorded into at least one block within the system group under control of the controller 101, or is correspondingly recorded into the data redundant area R of the read block. Such backup operation may avoid loss of the content recorded in the renewed read times table caused by sudden power-off of the non-volatile memory storage device 100.

As described above, the read times table may be stored to external of the non-volatile memory 103 (i.e. stored in the buffer memory 105 of the controller 101), and may also be stored into the non-volatile memory 103 (i.e. stored in at least one block within the system group or stored in the data redundant area R of the read block), or may even be stored independently in a system of the controller 101. Moreover, a counting direction of the counter within the controller 101 may be designed to be increasing or decreasing.

Next, in step S203, when the read times of the first block within the data group is greater than a predetermined value, data originally stored in the first block is renewed. In the present invention, assuming when the read times of the first block (for example, the block $B_0$) within the data group is greater than the predetermined value (i.e. the read times which may cause the read-disturb, for example, one million times, though the present invention is not limited thereto), the controller 101 may copy the data originally stored in the first block $B_0$ into a second block (for example a block $B_{n-1}$) within the spare group, and such a process is the process of renewing the data originally stored in the first block described in the step S203. Whereas, when the read times of the first block $B_0$ within the data group is less than the predetermined value, the data originally stored in the first block $B_0$ is not renewed.

In the present embodiment, the read times table further has a second counting value corresponding to the second block $B_{n-1}$, and the second counting value represents read times of the second block $B_{n-1}$.

Next, the controller 101 modifies a mapping relation of the logical-physical mapping table for substituting the first block $B_0$ with the second block $B_{n-1}$, and renews the first counting value recording the read times of the first block $B_0$ in the read times table. For example, the first counting value recording the read times of the first block $B_0$ is reset to 0 (i.e. reset to 0 from the one million). It should be noted that excessive renewing of the data may influence a performance of the non-volatile memory storage device 100, though if renewing of the data is not performed for a relatively long time, risk of data reading error is improved, and therefore the predetermined value may be defined to be a reasonable value according to a plurality of experiments, for example, may be defined to be different values between ten thousand times and ten million times according to different design requirements.

As described above, when the read times of the first block $B_0$ is greater than one million times, the data originally stored in the first block $B_0$ is then copied into the second block $B_{n-1}$ within the spare group under control of the controller 101, and the mapping relation in the logical-physical mapping table is modified for substituting the first block $B_0$ with the second block $B_{n-1}$. Therefore, according to the method for preventing read-disturb happened in the non-volatile memory of the present invention, read-disturb of the non-volatile memory 103 happened when a specific block therein is repeatedly read may be effectively suppressed.

However, it should be noted that influenced by fabrication factors, as the read times of the first block $B_0$ is increased, data originally stored in a third block (for example, a block $B_1$) adjacent to the first block $B_0$ may be indirectly influenced. Therefore, when the read times of the first block $B_0$ is greater than the million times, besides the data originally stored in the first block $B_0$ is copied into the second block $B_{n-1}$ within the spare group under control of the controller 101, data originally stored in the third block $B_1$ is also copied into a fourth block (for example, a block $B_n$) within the spare group under control of the controller 101.

In the present embodiment, the read times table further has a third counting value and a fourth counting value corresponding to the third block $B_1$ and the fourth block $B_n$, and the third counting value and the fourth counting value respectively represent read times of the third block $B_1$ and the fourth block $B_n$. Next, the controller 101 then modifies the mapping relation of the logical-physical mapping table for substituting the third block $B_1$ with the fourth block $B_n$, and renews the third counting value recording the read times of the third block $B_1$ in the read times table.

As described above, when the read times of a certain block within the data group reaches the predetermined value, according to the method for preventing read-disturb happened in the non-volatile memory of the present invention, not only data stored in the block with read times being greater than the predetermined value is renewed, but also data stored in a block (for example, a left or right block/an upper or a lower block) adjacent to the block with read times being greater than the predetermined value is also renewed. Therefore, according to the method for preventing read-disturb of the non-volatile memory of the present embodiment, all data stored in the non-volatile memory 103 may be correctly read.

Moreover, the present invention is not limited to the aforementioned embodiment. In another embodiment of the present invention, assuming when the read times of the first block (for example, the block $B_0$) within the data group is greater than the predetermined value (i.e. the read times which may cause the read-disturb, for example, one million times, though the present invention is not limited thereto), the controller 101 may first read the data originally stored in the first block $B_0$, and then temporarily stores the data into the buffer memory 101*c*.

Next, all data stored in the first block $B_0$ are erased by the controller 101. Thereafter, the data temporarily stored in the buffer memory which is originally stored in the first block $B_0$ is written back to the first block $B_0$ under control of the controller 101, and the first counting value recording the read times of the first block $B_0$ within the read times table is renewed. Such a process is the process of renewing the data originally stored in the first block described in the step S203. However, in the present embodiment, the mapping relation of the logical-physical mapping table is unnecessary to be modified by the controller 101.

The aforementioned data renewing refers to an action of rewriting data originally stored in a certain block (i.e. erase the certain block first and then write data originally stored in the certain block back into itself), wherein the data may be written into a different block or the original block. Therefore, as long as the data originally stored in the block is re-written, possibility of read-disturb of this block is then greatly reduced, and when the data originally stored in the block is re-written, the counting value recording the read times of the block within the read times table is then reset (for example, reset to 0).

Similarly, influenced by the fabrication factors, as the read times of the first block $B_0$ is increased, data originally stored in at leas a second block (for example, a block $B_1$) adjacent to the first block $B_0$ may be indirectly influenced. Therefore, when the read times of the first block $B_0$ is greater than the million times, besides the data originally stored in the first block $B_0$ is read and temporarily stored into the buffer memory 101*c* under control of the controller 101, data originally stored in the second block $B_1$ is also read and temporarily stored into the buffer memory 101*c* under control of the controller 101.

Next, all data stored in the second block $B_1$ are erased by the controller 101. Thereafter, the data temporarily stored in the buffer memory 101*c* which is originally stored in the second block $B_1$ is written back to the second block $B_1$ under control of the controller 101, and the second counting value recording the read times of the second block $B_1$ within the read times table is renewed. Therefore, according to the method for preventing read-disturb happened in the non-volatile memory of the present embodiment, all data stored in the non-volatile memory 103 may also be correctly read.

Accordingly, it should be noted that the minimum unit that records the read times of each block within the data group is the whole block, though the present invention is not limited thereto. In another embodiment of the present invention; the read times of each block within the data group are also recorded into the read times table, though the counter may count the read times of each page within each block of the data group under control of the controller 101, and as long as any page within a certain block is read, the block that the page belongs to is regarded to be read once.

For example, when data stored in a first page (for example a page $P_0$) within a first block (for example the block $B_0$) is read, the first counting value recording the read times of the first block $B_0$ within the read times table is then accumulated once or decreased once; and when data stored in a second page (for example a page $P_1$) within a second block (for example the block $B_1$) is read, the first counting value recording the read times of the second block $B_1$ within the read times table is then accumulated once or decreased once.

Similarly, when data stored in a third page (for example a page $P_2$) within a third block (for example the block $B_2$) is read, a third counting value recording the read times of the third block $B_2$ within the read times table is then accumulated once or decreased once; and when data stored in a fourth page (for example a page $P_3$) within a fourth block (for example the block $B_3$) is read, a fourth counting value recording the read times of the fourth block $B_3$ within the read times table is then accumulated once or decreased once. The rest may be deduced by analogy.

Certainly, to implement this embodiment, the read times table contains a plurality of counting values corresponding to each page within each block of the data group, and the counting values respectively represent the read times of each page within each block of the data group. Moreover, in the present embodiment, process of renewing data stored in any block is approximately the same to that disclosed in the aforementioned embodiment, and therefore detailed description thereof is not repeated.

According to another aspect, a program code executed by the controller 101 for controlling the non-volatile memory storage device 100 is generally stored in the program memory 101h. However, in an embodiment of the present invention, the program code executed by the controller 101 for controlling the non-volatile memory storage device 100 is stored in at least one block within the non-volatile memory 103. Therefore, the program code stored in the block will be frequently read during operation of the non-volatile memory storage device 100, and after frequent reading of the program code stored in the block, read-disturb may be occurred. Thus, the present invention provides another method for preventing read-disturb happened in the non-volatile memory for reference of those skilled in the art.

Figure 3:
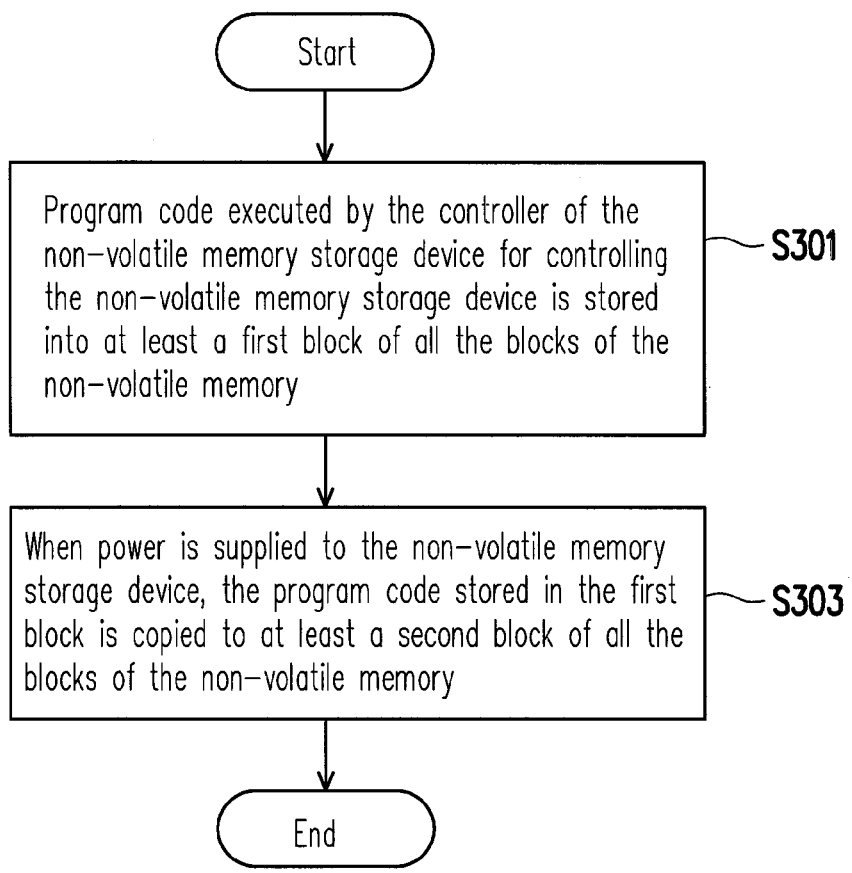
FIG. 3 is a flowchart illustrating a method for preventing read-disturb of the non-volatile memory according to another embodiment of the present invention.

FIG. 3 is a flowchart illustrating a method for preventing read-disturb of the non-volatile memory according to another embodiment of the present invention. Referring to FIG. 1 and FIG. 3, the method for preventing read-disturb happened in the non-volatile memory of the present embodiment is suitable for the non-volatile memory storage device 100, in which the non-volatile memory 103 includes a plurality of the blocks, and each block includes a plurality of the pages, and the method is also executed by the memory management module 101a, and steps of the method includes the following steps. First, in step S301, a program code executed by the controller 101 of the non-volatile memory storage device 100 for controlling the non-volatile memory storage device 100 is stored into at least a first block of all the blocks of the non-volatile memory 103. Next, in step S303, when power is supplied to the non-volatile memory storage device 100, the program code stored in the first block is copied into at least a second block of all the blocks of the non-volatile memory 103.

In the present embodiment, after the program code stored in the first block is copied into at least the second block of all the blocks of the non-volatile memory 103, the memory management module 101a further records the read times of the second block, and when the read times of the second block is greater than a predetermined value, the program code stored in the second block is then renewed.

Accordingly, since the program code executed by the controller 101 for controlling the non-volatile memory storage device 100 is stored into at least one block within the non-volatile memory 103, the program memory 101h within the controller 101 then may be omitted, so as to save a cost of the controller 101. Moreover, when the power is supplied to the non-volatile memory storage device 100, the program code stored in one block is copied into another block under control of the controller 101. Therefore, the block storing the copied program code may substitute the block originally storing the program code. By such means, read-disturb of the block originally storing the program code is avoided, and chances of occurring of errors, abnormity and loss of the program code may be greatly reduced.

In addition, since the block storing the copied program codes may be frequently accessed during operation of the non-volatile memory storage device 100, according to the spirit of the present invention, when the read times of the block storing the copied program codes is greater than a predetermined value (i.e. the read times which may cause the read-disturb, for example, one million times, though the present invention is not limited thereto), renewing of the block storing the copied program codes is similar to that of the aforementioned embodiment, and therefore detailed description thereof is not repeated.

Therefore, the method for preventing the read-disturb of the non-volatile memory provided by the present invention may not only guarantee reading correctness of all data stored in the non-volatile memory 103, but may also guarantee an integrity of the program code executed by the controller 101 for controlling the non-volatile memory storage device 100, which is stored in the non-volatile memory 103.

Figure 4:
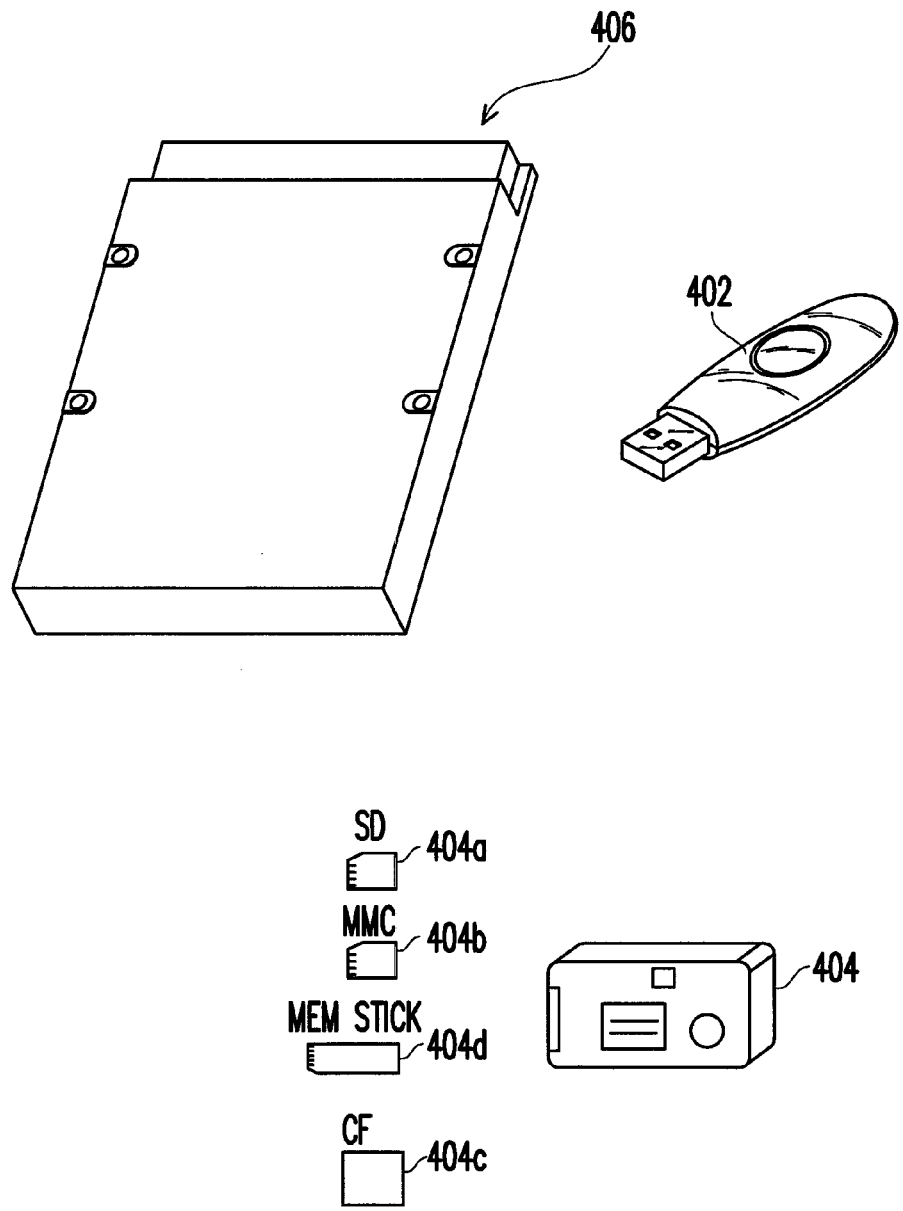
FIG. 4 is a schematic diagram illustrating application devices of a method for preventing read-disturb of the non-volatile memory of the present invention.

Accordingly, the method for preventing the read-disturb happened in the non-volatile memory of the present invention is suitable for various devices using the non-volatile memory as the storage media, such as a USB flash drive 402, and an SD card 404a, an MMC card 404b, a CF card 404c and a memory stick 404d used in a digital camera (video camera) 404, and a hard drive 406 etc shown in FIG. 4, wherein the hard drive 406 especially requires a better method for preventing the read-disturb of the non-volatile memory, so as to suppress a chance of the read-disturb.

In summary, in the method for preventing read-disturb of a non-volatile memory provided by the present invention, the read times table may be used for recording read times of each block or each page within the non-volatile memory. Accordingly, when the read times of a certain block or a certain page within the non-volatile memory is greater than the predetermined value, data stored in this block or the block where the page belongs to is then renewed. Therefore, according to the method for preventing read-disturb of a non-volatile memory provided by the present invention, not only chances of read-disturb is effectively suppressed, but also all data stored in the non-volatile memory may be correctly read.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for preventing read-disturb happened in a non-volatile memory, suitable for a non-volatile memory storage device, wherein the non-volatile memory comprises a plurality of physical blocks, each physical block comprises a plurality of pages, and the plurality of physical blocks are logically grouped into at least one data group, the method comprising:
   configuring a plurality of logical blocks for mapping the plurality of physical blocks of the at least one data group;
   storing program code executed by a controller of the non-volatile memory storage device for controlling the non-volatile memory storage device into at least one first block of the physical blocks, wherein the at least one first block is not belonging to the data group, and the at least one first block is not mapped to the logical blocks; and
   copying the program code stored in the at least one first block into at least one second block of the physical blocks when power is supplied to the non-volatile memory storage device, wherein the at least one second block is different from the at least one first block, the at least one second block is not belonging to the data group, and the at least one second block is not mapped to the logical blocks.

2. The method according to claim 1, further comprising: recording read times of the at least one second block; and renewing the program code stored in the at least one second block when the read times of the at least one second block is greater than a predetermined value.

3. The method according to claim 2, wherein the step of recording the read times of the at least one second block comprises:
   recording the read times of the at least one second block by using a read times table, wherein the read times table has a first counting value corresponding to the at least one second block, and the first counting value represents the read times of the at least one second block.

4. The method according to claim 3, wherein the step of renewing the program code stored in the at least one second block comprises:
   copying the program code stored in the at least one second block into at least one third block within the physical blocks, wherein the read times table further has a second counting value corresponding to the at least one third block, and the second counting value represents read times of the at least one third block; and
   substituting the at least one second block with the at least one third block, and renewing the first counting value.

5. The method according to claim 4, wherein the step of renewing the program code stored in the at least one second block further comprises:
   simultaneously renewing data originally stored in at least one fourth block adjacent to the at least one second block, wherein the read times table further has a third counting value corresponding to the at least one forth block, and the third counting value represents read times of the at least one fourth block.

6. A controller, suitable for a non-volatile memory storage device, the controller comprising:
   a micro processing unit, for controlling a whole operation of the controller;
   a non-volatile memory interface, electrically coupled to the micro processing unit, used for accessing the non-volatile memory, wherein the non-volatile memory comprises a plurality of physical blocks, and the plurality of physical blocks are logically grouped into at least one data group;
   a buffer memory, electrically coupled to the micro processing unit, used for temporarily storing data; and
   a memory management module, electrically coupled to the micro processing unit, used for managing the non-volatile memory, wherein the memory management module applies a method for preventing read-disturb happened in the non-volatile memory, the method comprises:
   configuring a plurality of logical blocks for mapping the plurality of physical blocks of the at least one data group;
   storing a program code executed by the controller for controlling the non-volatile memory storage device into at least one first block of the physical blocks, wherein the at least one first block is not belonging to the data group, and the at least one first block is not mapped to the logical blocks; and
   copying the program code stored in the at least one first block into at least one second block of the physical blocks when power is supplied to the non-volatile memory storage device, wherein the at least one second block is different from the at least one first block, the at least one second block is not belonging to the data group, and the at least one second block is not mapped to the logical blocks.

7. The controller according to claim 6, wherein the method further comprises:
   recording read times of the at least one second block; and
   renewing the program code stored in the at least one second block when the read times of the at least one second block is greater than a predetermined value.

8. The controller according to claim 7, wherein the step of recording the read times of the at least one second block comprises:
   recording the read times of the at least one second block by using a read times table, wherein the read times table has a first counting value corresponding to the at least one second block, and the first counting value represents the read times of the at least one second block.

9. The controller according to claim 8, wherein the step of renewing the program code stored in the at least one second block comprises:
   writing the program code stored in the at least one second block back to the at least one second block, and renewing the first counting value; alternatively, copying the program code stored in the at least one second block to at least one third block of the physical blocks, and substituting the at least one second block with the at least one third block, and renewing the first counting value;
   wherein the read times table further has a second counting value corresponding to the at least one third block, and the second counting value represents read times of the at least one third block.

10. The controller according to claim 9, wherein the step of renewing the program code stored in the at least one second block further comprises:
    simultaneously renewing data originally stored in at least one fourth block adjacent to the at least one second block, wherein the read times table further has a third counting value corresponding to the at least one fourth block, and the third counting value represents read times of the at least one fourth block.

11. A method for preventing read-disturb happened in a non-volatile memory, suitable for a non-volatile memory storage device, wherein the non-volatile memory comprises a plurality of blocks, each block comprises a plurality of pages, and the plurality of blocks are logically grouped into at least a data group, the method comprising:

storing program code executed by a controller of the non-volatile memory storage device for controlling the non-volatile memory storage device into at least a first block of the blocks, wherein the first block is not belonging to the data group;

copying the program code stored in the first block into at least a second block of the blocks when power is supplied to the non-volatile memory storage device, wherein the second block is different from the first block, and the second block is not belonging to the data group;

recording read times of the second block; and renewing the program code stored in the second block when the read times of the second block is greater than a predetermined value, wherein the step of renewing the program code stored in the second block further comprises:

renewing data originally stored in at least a fourth block adjacent to the second block.

12. The method according to claim 11, wherein the step of recording the read times of the second block comprises:

recording the read times of the second block by using a read times table, wherein the read times table has a first counting value corresponding to the second block, and the first counting value represents the read times of the second block.

13. The method according to claim 12, wherein the step of renewing the program code stored in the second block comprises:

copying the program code stored in the second block into at least a third block within the blocks, wherein the read times table further has a second counting value corresponding to the third block, and the second counting value represents read times of the third block; and substituting the second block with the third block, and renewing the first counting value.

14. The method according to claim 12, wherein the read times table further has a third counting value corresponding to the forth block, and the third counting value represents read times of the fourth block.

\* \* \* \* \*